United States Patent
Yeh

(10) Patent No.: US 11,631,461 B2
(45) Date of Patent: Apr. 18, 2023

(54) THREE DIMENSION MEMORY DEVICE

(71) Applicant: MACRONIX International Co., Ltd., Hsinchu (TW)

(72) Inventor: Teng-Hao Yeh, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 85 days.

(21) Appl. No.: 17/477,205

(22) Filed: Sep. 16, 2021

(65) Prior Publication Data

US 2023/0082248 A1    Mar. 16, 2023

(51) Int. Cl.

| G11C 16/08 | (2006.01) |
| G11C 5/02 | (2006.01) |
| G11C 8/14 | (2006.01) |
| H01L 23/522 | (2006.01) |
| H01L 23/528 | (2006.01) |

(52) U.S. Cl.
CPC .......... *G11C 16/08* (2013.01); *H01L 23/5226* (2013.01); *H01L 23/5286* (2013.01); *H10B 41/27* (2023.02); *H10B 41/40* (2023.02); *H10B 43/27* (2023.02); *H10B 43/40* (2023.02)

(58) Field of Classification Search
None
See application file for complete search history.

(56) References Cited

U.S. PATENT DOCUMENTS

| 9,190,150 | B2* | 11/2015 | Sakanushi | G11C 16/0483 |
| 2013/0052803 | A1* | 2/2013 | Roizin | H01L 29/66825 |
| | | | | 257/E21.09 |
| 2013/0134377 | A1* | 5/2013 | Park | H01L 27/249 |
| | | | | 257/E27.005 |
| 2014/0038400 | A1 | 2/2014 | Park et al. | |
| 2014/0192594 | A1 | 7/2014 | Lue | |
| 2016/0013202 | A1* | 1/2016 | Hwang | G11C 16/0483 |
| | | | | 257/314 |
| 2017/0103999 | A1* | 4/2017 | Lee | H01L 23/528 |

FOREIGN PATENT DOCUMENTS

TW         201503287         1/2015

OTHER PUBLICATIONS

"Office Action of Taiwan Counterpart Application", dated Jul. 19, 2022, p. 1-p. 5.

* cited by examiner

*Primary Examiner* — Tan T. Nguyen
(74) *Attorney, Agent, or Firm* — J.C. PATENTS

(57) ABSTRACT

A three dimension memory device including a plurality of word lines, a plurality of first switches, a plurality of second switches and N conductive wire layers is provided, where N is a positive integer larger than 1. The word lines are divided into a plurality of word line groups. The first switches receive a common word line voltage. The second switches receive a reference ground voltage. A first word line group is connected to a first conductive wire layer through a second conductive wire layer. An $i^{th}$ word line group is connected to the first conductive wire layer through an $(i+1)^{th}$ to the second conductive wire layer in sequence.

20 Claims, 6 Drawing Sheets

THREE DIMENSION MEMORY DEVICE

BACKGROUND

Technical Field

The invention relates to a three dimension memory device, and particularly relates to a layout structure of word lines of a three dimension memory device.

Description of Related Art

In a three dimension memory device, along with increase of a circuit size, a circuit layout of the memory device becomes more complicated. Especially, regarding a layout of word lines, a length of a transmission path of word line signals is often an important factor on access performance of the memory device. Especially under a demand for high-speed access, how to reduce a load of capacitance and resistance on the transmission path of the word line signals is also an important factor for improving signal transmission quality.

SUMMARY

The invention is directed to a three dimension memory device, which is adapted to simplify layout complexity of word lines.

The invention provides a three dimension memory device including a plurality of word lines, a plurality of first switches, a plurality of second switches and N conductive wire layers, where N is a positive integer larger than 1. The word lines are divided into a plurality of word line groups. The first switches receive a common word line voltage. The second switches receive a reference ground voltage. A plurality of transmission conductive wires of a first conductive wire layer are connected to a plurality of transmission conductive wires of a second conductive wire layer. The transmission conductive wires of the first conductive wire layer are respectively coupled to the first switches and the second switches. A first word line group is connected to the first conductive wire layer through the second conductive wire layer. An $i^{th}$ word line group is connected to the first conductive wire layer through an $(i+1)^{th}$ conductive wire layer to the second conductive wire layer in sequence, where $N>i>1$.

Based on the above description, the three dimension memory device of the invention divides the word lines into a plurality of word line groups. The word line groups are respectively connected to the corresponding switches through the transmission conductive wires of two to more conductive wire layers, and are coupled to the common word line. Through the grouping method, a layout of the word lines may be effectively simplified, thereby improving electrical characteristics of the three dimension memory device and reducing an area required for the circuit layout.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
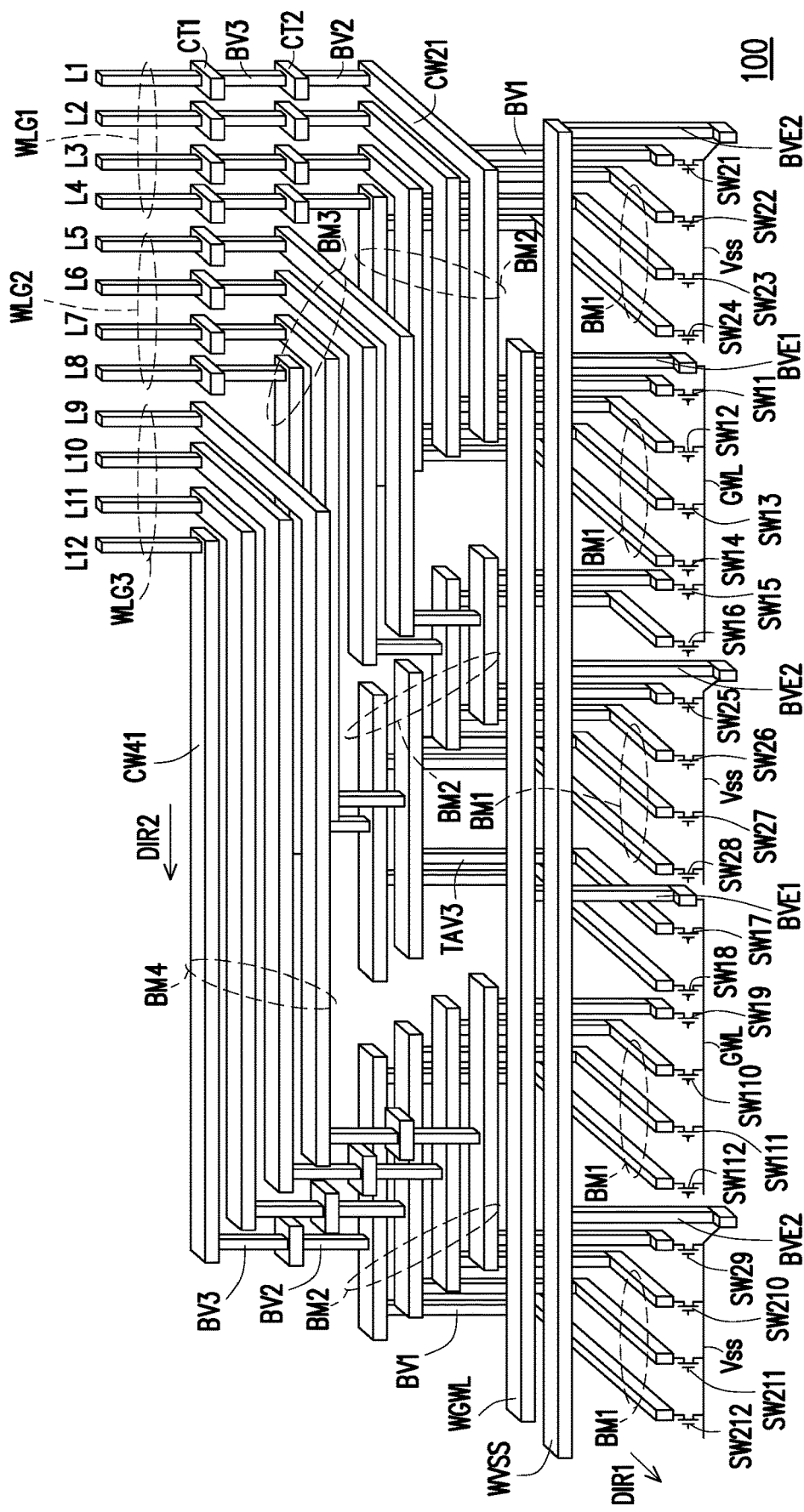
FIG. 1 is a schematic diagram of a three dimension memory device according to an embodiment of the invention.

Referring to FIG. 1, FIG. 1 is a schematic diagram of a three dimension (3D) memory device according to an embodiment of the invention. A three dimension memory device 100 includes a plurality of word lines L1-L12, a plurality of first switches SW11-SW112, a plurality of second switches SW21-SW212, and a plurality of conductive wire layers BM1-BM4. In the embodiment, the word lines L1-L12 may be divided into three word line groups WLG1-WLG3. Where, the word lines L1-L4 belong to the word line group WLG1, the word lines L2-L8 belong to the word line group WLG2, and the word lines L9-L12 belong to the word line group WLG3. One ends of the first switches SW11-SW112 may commonly receive a common word line voltage GWL, and the other ends of the first switches SW11-SW112 are respectively coupled to a plurality of transmission conductive wires of a first conductive wire layer BM1. One ends of the second switches SW21-SW212 may commonly receive a reference ground voltage Vss, and the other ends of the second switches SW21-SW212 are respectively coupled to the plurality of transmission conductive wires of the first conductive wire layer BM1. The conductive wire layers BM1-BM4 are sequentially arranged between the first switches SW11-SW112, the second switches SW21-SW212, and the word lines L1-L12. In the embodiment, the conductive wire layers BM1-BM4 may be bottom metal layers of an integrated circuit. The word lines L1-L12 may coupled to a memory cell array of the three dimension memory device 100 through a through array via (TAV) structure.

Each of the conductive wire layers BM1-BM4 has a plurality of transmission conductive wires. In the embodiment, the transmission conductive wires in the first wire layer BM1 may extend in a first direction DIR1, and the transmission conductive wires in the remaining conductive wire layers BM2-BM4 other than the first conductive wire layer BM1 all extend in a second direction DIR2. Where, the first direction DIR1 is different from the second direction DIR2. The first direction DIR1 and the second direction DIR2 may be orthogonal to each other. It should be noted that in FIG. 1, the transmission conductive wires of the conductive wire layers BM2-BM4 may be L-shaped or bar-shaped transmission conductive wires. For example, a transmission conductive wire CW41 is a bar-shaped transmission conductive wire, and a transmission conductive wire CW21 is an L-shaped transmission conductive wire. Regardless of a type of the transmission conductive wire, a rear end of the transmission conductive wire extends in the second direction DIR2.

On the other hand, in the embodiment, the transmission conductive wires between two adjacent conductive wire layers may be connected to each other through a conductive via structure. In detail, the transmission conductive wires of the conductive wire layer BM4 and the conductive wire layer BM3 are connected to each other through a conductive via structure BV3; the transmission conductive wires of the conductive wire layer BM3 and the conductive wire layer BM2 are connected to each other through a conductive via structure BV2; the transmission conductive wires of the conductive wire layer BM2 and the conductive wire layer BM1 are connected to each other through a conductive via structure BV1.

It should be noted that in the embodiment, the word lines L1-L12 divided into different word line groups WLG1-WLG3 have different wiring methods. Where, the word lines L1-L4 of the first word line group WLG1 may be directly connected to the second conductive wire layer BM2 through the conductive via structure BV3 and the conductive via structure BV2, and are then connected to the first conductive wire layer BM1 through the transmission conductive wires of the second conductive wire layer BM2 and the conductive via structure BV1. In detail, when the word lines L1-L4 of the first word line group WLG1 pass through the fourth conductive wire layer BM4 and the third conductive wire layer BM3, the word lines L1-L4 may be respectively connected to the conductive via structures BV3 and BV2 through contact windows CT1 and CT2. In addition, the word lines L5-L8 of the second word line group WLG2 are first connected to the transmission conductive wires of the third conductive wire layer BM3 directly through the contact window CT1 and the conductive via structure BV3; connected to the transmission conductive wires of the second conductive wire layer BM2 through the transmission conductive wires of the third conductive wire layer BM3 and the conductive via structure BV2; and then connected to the transmission conductive wires of the first conductive wire layer BM1 through the transmission conductive wires of the second conductive wire layer BM2 and the conductive via structure BV1. The word lines L9-L12 of the third word line group WLG3 are directly connected to the transmission conductive wires of the fourth conductive wire layer BM3; connected to the transmission conductive wires of the third conductive wire layer BM3 through the conductive via structure BV3; connected to the transmission conductive wires of the second conductive wire layer BM2 through the transmission conductive wires of the third conductive wire layer BM3 and the conductive via structure BV2; and then connected to the transmission conductive wires of the first conductive wire layer BM1 through the transmission conductive wires of the second conductive wire layer BM2 and the conductive via structure BV1.

Certainly, in other embodiments of the invention, number of the word lines, number of the word line groups, and number of the conductive wire layers may all be different from those in FIG. 1. In terms of configuration details, the number of the conductive wire layers is, for example, equal to N (N is a positive integer greater than 1), where the plurality of transmission conductive wires of the first conductive wire layer are connected to the plurality of transmission conductive wires of the second conductive wire layer, and the transmission conductive wires of the first conductive wire layer are respectively coupled to the first switches and the second switches, the first word line group may be connected to the first conductive wire layer through the second conductive wire layer, and an $i^{th}$ word line group is connected to the first conductive wire layer through an $(i+1)^{th}$ conductive wire layer to the second conductive wire layer in sequence, where $N>i>1$.

On the other hand, the three dimension memory device 100 of the embodiment further includes a common word voltage transmission conductive wire WGWL and a reference ground voltage transmission conductive wire WVSS. The common word voltage transmission conductive wire WGWL and the reference ground voltage transmission conductive wire WVSS may be arranged along the second direction DIR2, where the common word voltage transmission conductive wire WGWL may be coupled to the first switches SW11-SW112 through the conductive via structure BVE1, and the reference ground voltage transmission conductive wire WVSS may be coupled to the second switches SW21-SW212 through the conductive via structure BVE2. The common word voltage transmission conductive wire WGWL is used to provide a common word line voltage GWL, and the reference ground voltage transmission conductive wire WVSS is used to provide a reference ground voltage Vss.

The first switches SW11-SW112 and the second switches SW21-SW212 may form a plurality of drivers, respectively. In the embodiment, the first switches SW11-SW112 are P-type transistors, and the second switches SW21-SW212 are N-type transistors. Each of the first switches SW11-SW112 and the corresponding one of the second switches SW21-SW212 form a complementary metal-oxide-semiconductor (CMOS) structure, and are used to make the corresponding word lines L1-L12 to be equal to the reference ground voltage Vss or the common word line voltage GWL.

Figure 2:
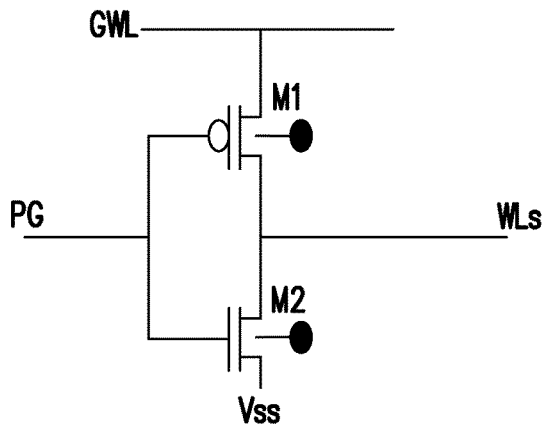
FIG. 2 is a circuit diagram of an implementation of drivers used for driving word lines in the three dimension memory device of the embodiment of the invention.

Referring to FIG. 2, FIG. 2 is a circuit diagram of an implementation of drivers used for driving word lines in the three dimension memory device of the embodiment of the invention. A driver 200 includes transistors M1 and M2. The transistor M1 corresponds to one of the first switches SW11-S112 of FIG. 1, and the transistor M2 corresponds to one of the second switches SW21-S212 of FIG. 1. A first terminal of the transistor M1 receives the common word line voltage GWL, and a second terminal of the transistor M1 is coupled to a first terminal of the transistor M2 and generates a word line signal WLs. A second terminal of the transistor M2 receives the reference ground voltage Vss. Control terminals of the transistors M1 and M2 are coupled to each other and receive a control signal PG.

Referring to FIG. 1 again, in the embodiment, the first switches SW11-SW112 may be divided into a plurality of groups (for example, M groups) for layout, and the second switches SW21-SW212 may be divided into a plurality of groups (for example, P groups) for layout. In FIGS. 1, M=2 and P=3. In other embodiments of the invention, M and P may be other positive integers, and M may be equal to P without any specific limitation.

According to FIG. 1, it is known that in the embodiment of the invention, the word lines L1-L12 are divided into the word line groups WLG1-WLG3, and each of the word line groups WLG1-WLG3 is successively coupled to the drivers through the transmission conductive wires of a few to multiple conductive wire layers. In this way, the layout of the word lines L1-L12 may be neatly and simply completed, which effectively reduces the complexity of the layout. In addition, through the grouping layout, a layout number of the transmission conductive wires in a same area may be reduced, and a pitch between the transmission conductive wires may be increased, which reduces generation of a parasitic effect between signals.

Figure 3:
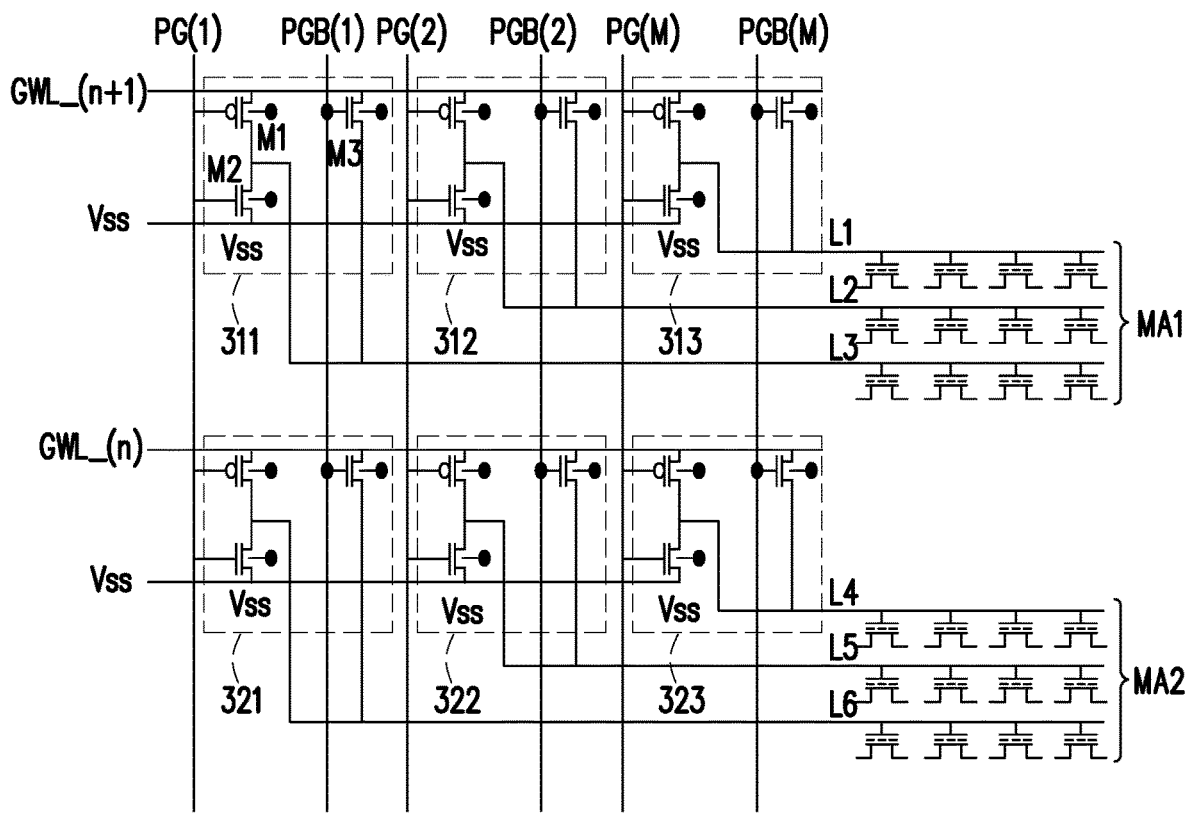
FIG. 3 is a circuit diagram of another implementation of the drivers of the word lines according to an embodiment of the invention.

Referring to FIG. 3, FIG. 3 is a circuit diagram of another implementation of the drivers of the word lines according to an embodiment of the invention. A plurality of drivers 311-313 are coupled to a memory cell array MA1, and a plurality of drivers 321-323 are coupled to a memory cell array MA2. The drivers 311-313 are used to drive the word lines L1-L3 of the memory cell array MA1, and the drivers 321-323 are used to drive the word lines L4-L6 of the memory cell array MA2.

Taking the driver 311 as an example, the driver 311 includes three switches respectively formed by three transistors M1-M3. Where, a first terminal of the transistor M1 receives a common word line voltage GWL[n+1], a second terminal of the transistor M1 and a first terminal of the transistor M2 are commonly coupled to the word line L1, control terminals of the transistors M1 and M2 receive a control signal PG[1], and a second terminal of the transistor M2 receives the reference ground voltage Vss. In addition, different to the embodiment of FIG. 2, the driver 311 further includes the transistor M3. A first terminal of the transistor M3 receives the common word line voltage GWL[n+1], a second terminal of the transistor M3 is coupled to the word line L1, and a control terminal of the transistor M3 receives an inverted control signal PGB[1]. Where, the inverted control signal PGB[1] and the control signal PG[1] are inverted to each other.

It should be noted that the transistor M1 may be a P-type transistor, and the transistors M2 and M3 may both be N-type transistors. When the control signal PG[1] is at logic 0, the transistor M1 may be turned on, the transistor M2 may be turned off, and a voltage on the word line L1 is equal to the common word line voltage GWL[n+1]. When the control signal PG[1] is at logic 1, the transistor M1 may be turned off, the transistor M2 may be turned on, and the voltage on the word line L1 is equal to the reference ground voltage.

In the embodiment of FIG. 3, since multiple memory cell arrays MA1 and MA2 may be sequentially selected for accessing, the common word line voltages GWL[n] and GWL[n+1] may be sequentially activated according to a scanning sequence. In the driver 311, if the memory cell array MA1 is not selected, the common word line voltage GWL[n+1] may be 0 volt. When the control signal PG[1] is at logic 0, the word line L1 may be in a state higher than 0 volt due to a body effect of the transistor M1. Therefore, in the embodiment, through the transistor M3 that is simultaneously turned on according to the inverted control signal PGB[1], the word line L1 may be pulled down to 0 volt, and the unselected memory cell array MA1 will not produce a phenomenon of reading and writing interference.

In the embodiment, the drivers 311 and 321 may share the same control signal PG[1] and the inverted control signal PGB[1]; the drivers 312 and 322 may share the same control signal PG[2] and the inverted control signal PGB[2]; and the drivers 313 and 323 may share the same control signal PG[3] and the inverted control signal PGB[3].

It should be noted that in the embodiment, a substrate of the transistor M1 may be an N well, and a substrate of the transistors M2 and M3 may be a P-type deep well (PWI).

In addition, in the memory device, the common word line voltages GWL[n] and GWL[n+1] generally require a relatively high voltage when being enabled. Therefore, at a front end of the drivers 311-323, a level shifter (not shown) is often configured to generate the common word line voltages GWL[n] and GWL[n+1] with sufficient voltage.

Figure 4:
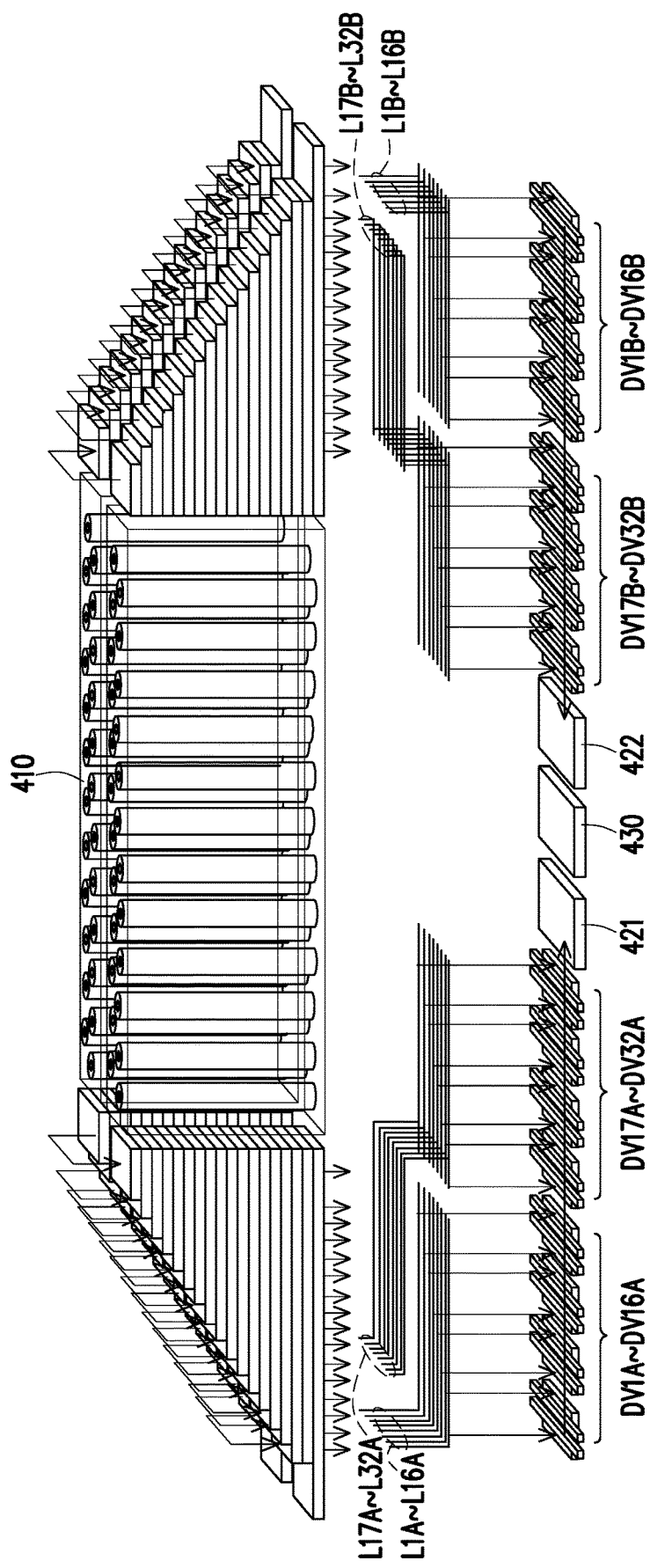
FIG. 4 is a schematic diagram of a layout structure of a three dimension memory device according to an embodiment of the invention.

Referring to FIG. 4, FIG. 4 is a schematic diagram of a layout structure of a three dimension memory device according to an embodiment of the invention. In a three dimension memory device 400, a memory cell array 410 is coupled to a plurality of word lines L1A-L32A and L1B-L32B. The three dimension memory device 400 also has drivers DV1A-DV32A and DV1B-DV32B, level shifters 421 and 422, and a control logic circuit 430. The word lines L1A-L32A and L1B-L32B are respectively arranged on two sides of the three dimension memory device 400. Corresponding to the positions of the word lines L1A-L32A and L1B-L32B, the drivers DV1A-DV32A and DV1B-DV32B are respectively arranged on two sides of the three dimension memory device 400. The drivers DV1A-DV16A and DV17A-DV32A are respectively used to drive the word lines L1A-L16A and L17A-L32A. The drivers DV1B-DV16B and DV17B-DV32B are respectively used to drive the word lines L1B-L16B and L17B-L32B.

The connection mode between the word lines L1A-L32A and L1B-L32B and the drivers DV1A-DV32A, DV1B-DV32B is the same as the layout mode stated in the embodiment of FIG. 1, which is not repeated.

The control logic circuit 430 may generate a first control signal and a second control signal according to an accessed address of the memory cell array 410. The level shifters 421 and 422 are arranged on the two sides of the control logic circuit 430. The level shifters 421 and 422 are used to increase a voltage value of the common word line voltage, and respectively provide the common word line voltage to the drivers DV1A-DV32A and the drivers DV1B-DV32B.

It should be noted that the memory cell array 410 in the embodiment is an AND type flash memory cell array.

Figure 5:
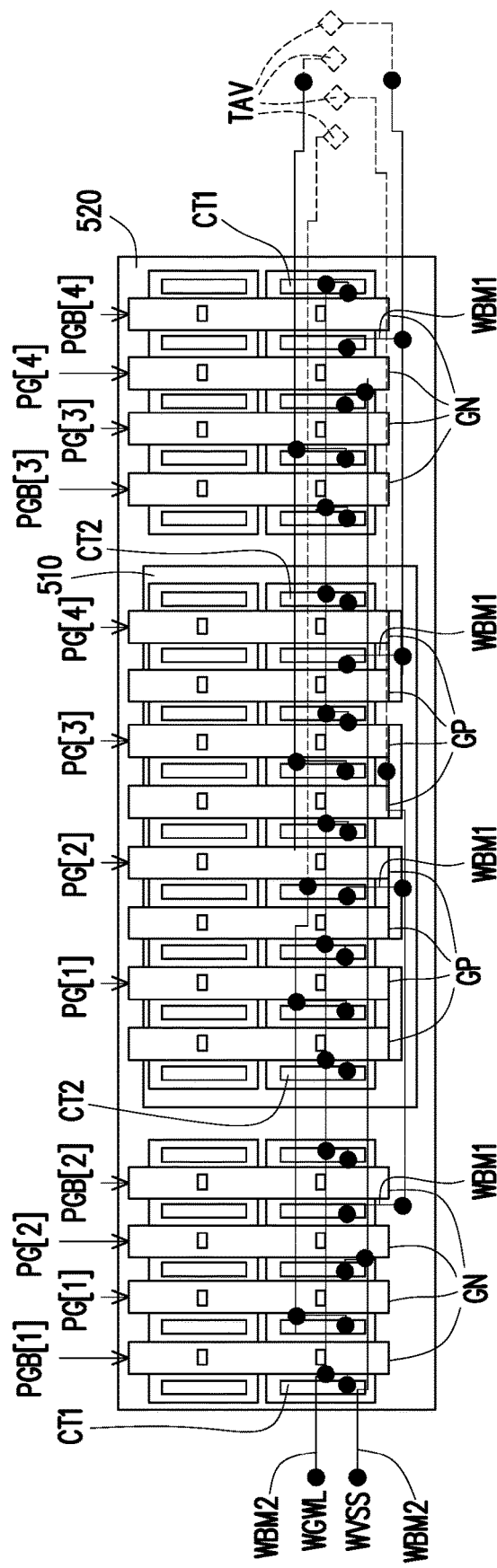
FIG. 5 is a top view of a layout structure of drivers of word lines in a three dimension memory device according to an embodiment of the invention.

Referring to FIG. 5, FIG. 5 is a top view of a layout structure of drivers of word lines in a three dimension memory device according to an embodiment of the invention. There is a plurality of gate structures GN on both sides of a substrate 520 and a plurality of N-type transistors are formed. There is a well region 510 at a central portion of the substrate 520. There is a plurality of gate structures GP on the well region 510 and a plurality of P-type transistors are formed. Where, a source and a drain of each N-type transistor may have a contact window CT1 of a trench structure, and a source and a drain of each P-type transistor may have a contact window CT2 of a trench structure. Through the contact windows CT1 and CT2, each N-type transistor and each P-type transistor may be connected to the transmission conductive wire WBM2 on the second conductive wire layer through the transmission conductive wire WBM1 on the first conductive wire layer. The transmission conductive wire WBM2 on the second conductive wire layer is then connected to the conductive via structure TAV, and is coupled to the corresponding multiple word lines through the conductive via structure TAV.

In addition, the transmission conductive wire WBM2 on the second conductive wire layer may be used to provide the common word line voltage WGWL and the reference ground voltage WVSS to each P-type transistor and each N-type transistor.

Each of the gate structures GN and GP may receive one of the control signals PG[1], PG[2], PG[3] and PG[4] and the inverted control signals PGB[1], PGB[2], PGB[3] and PGB[4]. The control signals PG[1], PG[2], PG[3] and PG[4] and the inverted control signals PGB[1], PGB[2], PGB[3] and PGB[4] are used to control turned on or cut off status of corresponding transistors.

Figure 6:
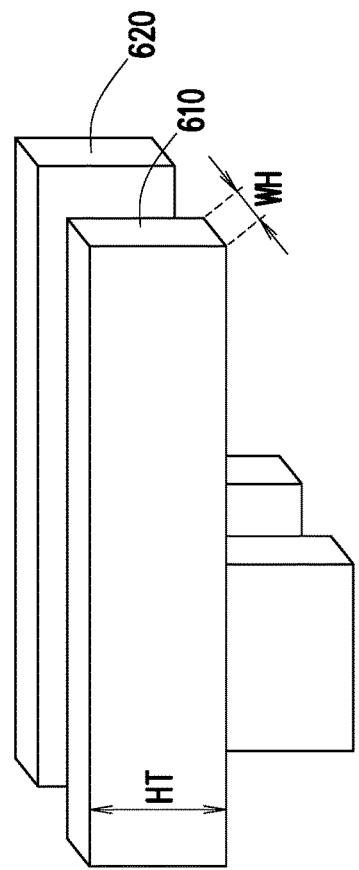
FIG. 6 is a partial three-dimensional view of transmission conductive wires of a three dimension memory device according to an embodiment of the invention.

Referring to FIG. 6, FIG. 6 is a partial three-dimensional view of transmission conductive wires of a three dimension memory device according to an embodiment of the invention. Transmission conductive wires 610 and 620 are two adjacent transmission conductive wires of a same conductive wire layer. The word lines are grouped based on the concept of the invention, and the word lines of different word line groups are connected to the drivers of the word lines through different mechanisms. In this way, a density of the transmission conductive wires in a same area may be effectively reduced. Namely, a pitch between the transmission conductive wires 610 and 620 may be enlarged, and a wire width WH of the transmission conductive wire 610 may be increased. In addition, the embodiment of the invention may increase a wire height HT of the transmission conductive wire 610. In this way, an equivalent resistance of the transmission conductive wire 610 may be effectively reduced, which improves transmission efficiency of word line signals.

Figure 7:
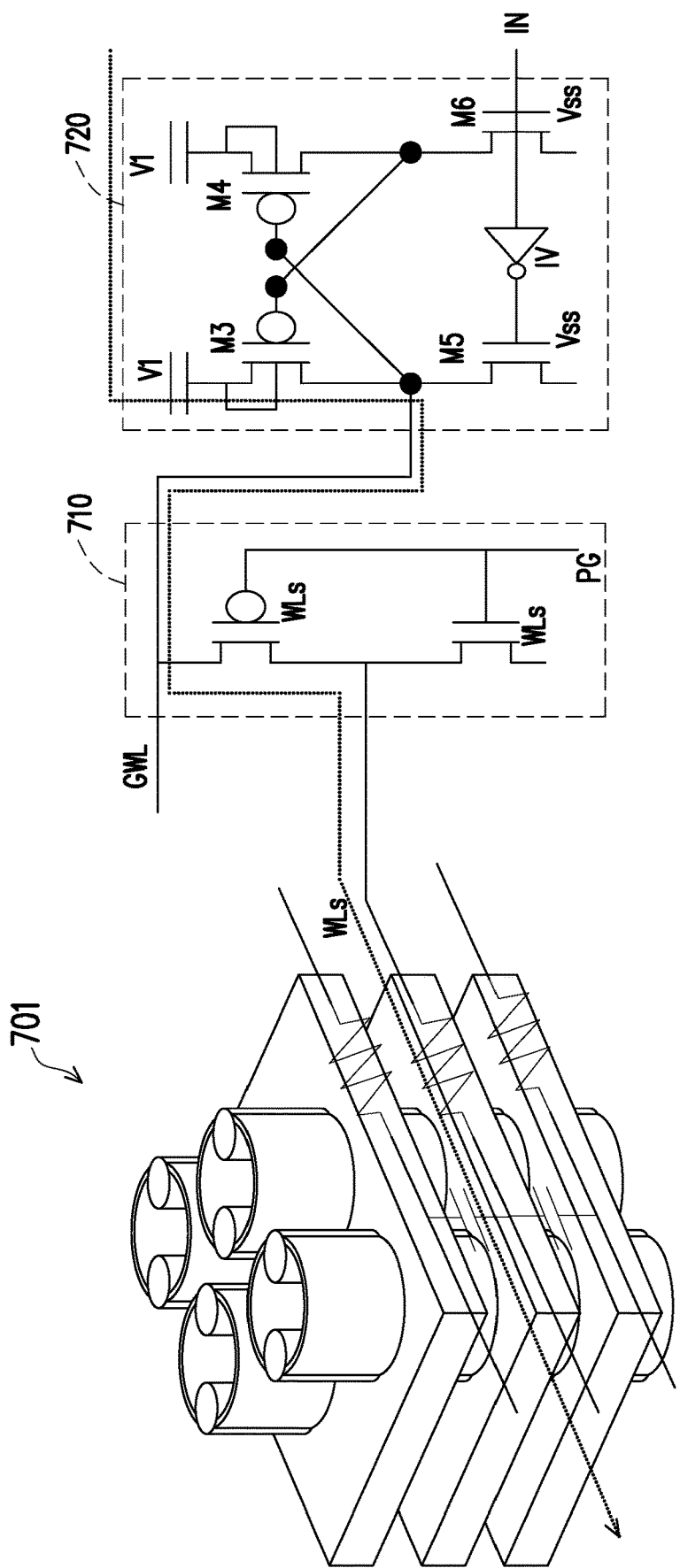
FIG. 7 is a schematic diagram of a driving mechanism of word lines in a three dimension memory device according to an embodiment of the invention.

Referring to FIG. 7, FIG. 7 is a schematic diagram of a driving mechanism of word lines in a three dimension memory device according to an embodiment of the invention. In the embodiment, the three dimension memory device provides a word line signal WLs to selected word lines of a memory cell array 701 through a level shifter 720 and a driver 710. Where, the driver 710 includes transistors M1 and M2. The transistors M1 and M2 are coupled in series with each other. The transistor M1 receives the common word line voltage GWL provided by the level shifter 720, and makes the word line signal WLs to be equal to the common word line voltage GWL when the transistor M1 is turned on according to the control signal PG, and activates an access operation of the corresponding memory cell.

The level shifter 720 in the embodiment includes transistors M3-M6 and an inverter IV. First terminals of the transistors M3 and M4 receive a voltage V1, and control terminals of the transistors M3 and M4 are respectively coupled to second terminals of the transistors M4 and M3. The transistor M5 is connected in series between the transistor M3 and the reference ground voltage Vss, and the transistor M6 is connected in series between the transistor M4 and the reference ground voltage Vss. The inverter IV is connected in series between control terminals of the transistors M5 and M6. The inverter IV receives an input signal IN and provides an output signal to the control terminal of the transistor M5.

In view of operation details, when the input signal is at logic 1, the transistor M6 is turned on, and the transistor M5 is turned off. The turned-on transistor M6 may pull down a voltage on the control terminal of the transistor M3 to the reference ground voltage Vss to turn on the transistor M3. At this moment, the transistor M4 is turned off. The turned-on transistor M3 may pull up the common word line voltage GWL to the voltage V1. When the input signal is at logic 0, the transistor M6 is turned off, but the transistor M5 is turned on according to the output signal of the inverter IV. The turned-on transistor M5 may provide the reference ground voltage Vss to the control terminal of the transistor M4 to turn on the transistor M4. The turned-on transistor M4 allows the control terminal of the transistor M3 to receive the voltage V1, and makes the transistor M3 to be turned off. Therefore, based on the turned-off transistor M3 and the turned-on transistor M5, the common word line voltage GWL is pulled down to be equal to the reference ground voltage Vss.

The circuit details of the aforementioned level shifter 720 are only an example for illustration. Other types of level shifters known to those with ordinary knowledge in the art may also be applied to the invention without specific limitations.

It should be noted that the memory cell array 701 of the embodiment is an AND type flash memory cell array with a three-dimensional arrangement.

Figure 8:
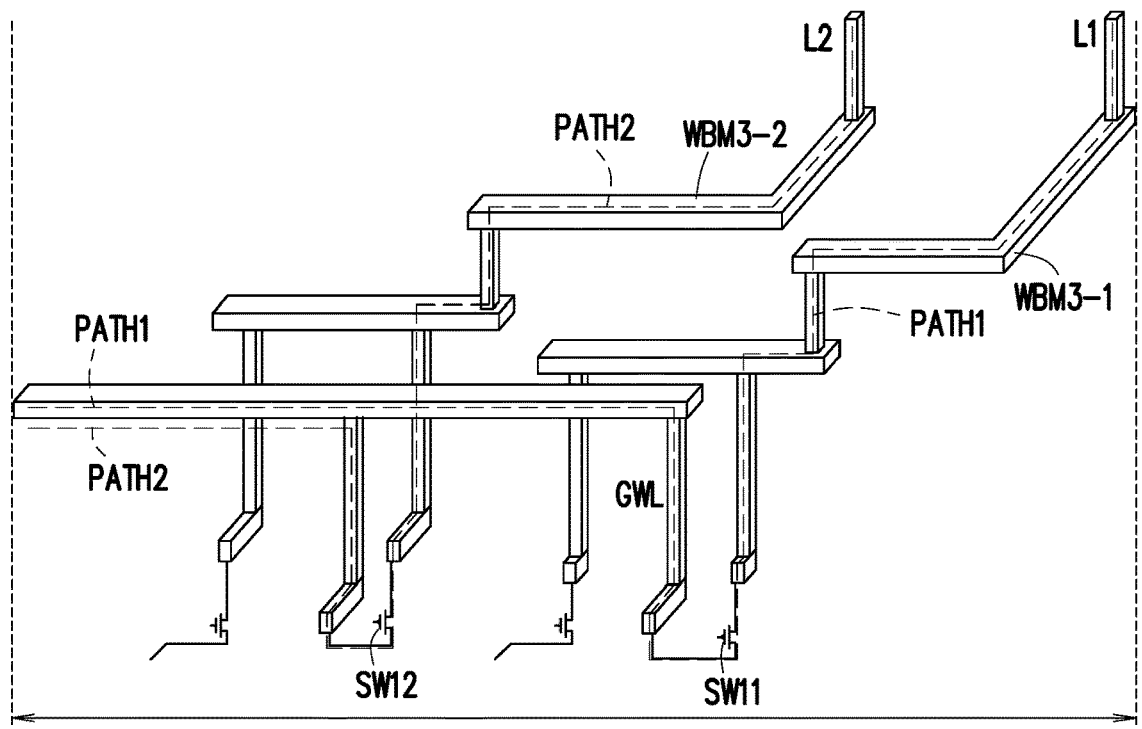
FIG. 8 is a schematic diagram of layout paths of word lines of a three dimension memory device according to an embodiment of the invention.

Referring to FIG. 8, FIG. 8 is a schematic diagram of layout paths of word lines of a three dimension memory device according to an embodiment of the invention. In FIG. 8, the word line L1 may be connected to the switch SW11 through a transmission path PATH1, and connected to a source of the common word line voltage GWL through the switch SW11. The word line L2 may be connected to the switch SW12 through a transmission path PATH2, and connected to the source of the common word line voltage GWL through the switch SW12. The transmission path PATH1 has a relatively short transmission distance on a transmission conductive wire WBM3-1, but the transmission path PATH1 may have a relatively long transmission distance at the source of the switch SW11 and the common word line voltage GWL. In contrast, the transmission path PATH2 has a relatively long transmission distance on a transmission conductive wire WBM3-2, but the transmission path PATH2 has a relatively short transmission distance at the source of the switch SW12 and the common word line voltage GWL. Therefore, it is known that the lengths of the transmission path PATH1 and the transmission path PATH2 may be substantially equal. In other words, the word lines L1 and L2 of the embodiment of the invention may substantially have the same load of capacitance and resistance, so that the signal quality of the word line signals may have certain uniformity.

Figure 9:
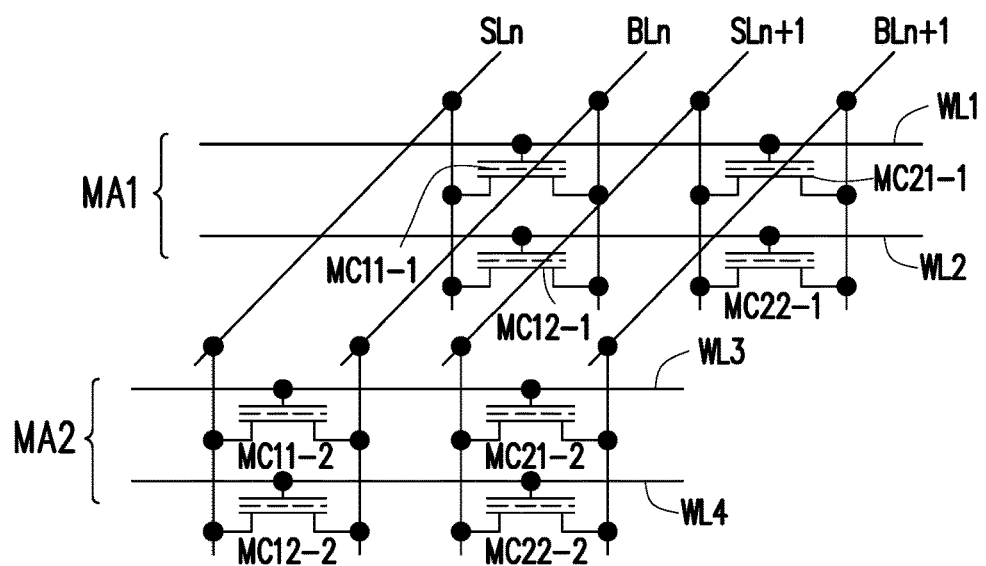
FIG. 9 is a schematic diagram of a memory cell array of a three dimension memory device according to an embodiment of the invention.

Referring to FIG. 9, FIG. 9 is a schematic diagram of a memory cell array of a three dimension memory device according to an embodiment of the invention. A three dimensional memory device 900 includes memory cell arrays MA1 and MA2. The memory cell array MA1 includes memory cells M11-1 to M22-1, and the memory cell array MA2 includes memory cells M11-2 to M22-2. In the memory cell array MA1, the memory cells MC11-1 and MC12-1 of the same column are coupled to a same source line SLn and bit line BLn, but are respectively coupled to different word lines WL1 and WL2; the memory cells MC21-1 and MC22-1 of the same column are coupled to a same source line SLn+1 and bit line BLn+1, but are respectively coupled to different word lines WL1 and WL2. In addition, the memory cells MC11-1 and MC21-1 of the same row are coupled to the same word line WL1, but are respectively coupled to different source lines SLn, SLn+1 and different bit lines BLn, BLn+1; the memory cells MC12-1 and MC22-1 of the same row are coupled to the same word line WL2, but are respectively coupled to different source lines SLn, SLn+1 and different bit lines BLn, BLn+1.

In the embodiment, the memory cell array MA2 and the memory cell array MA1 have the same arrangement of memory cells, which will not be repeated. It should be noted that the memory cell array MA2 and the memory cell array MA1 may share the source lines SLn, SLn+1 and the bit lines BLn, BLn+1, but are coupled to independent word lines WL1, WL2, and WL3, WL4.

The memory cells M11-1 to M22-1 and M11-2 to M22-2 of the embodiment are flash memory cells. According to the arrangement of the memory cells M11-1 to M22-1 and M11-2 to M22-2, the arrangement of the memory cell array MA1 and the memory cell array MA2 is an AND type flash memory cell array.

In summary, in the three dimension memory device of the invention, the word lines are divided into a plurality of word line groups, and the plurality of word line groups are respectively laid in the transmission conductive wires in the plurality of conductive wire layers through different downstairs methods. In this way, the layout of the word lines may be simplified. In a layout demand of a large amount of word lines, in addition to completing the layout quickly and easily, a density of the transmission conductive wires in a unit area is reduced, electrical characteristics of the transmission conductive wires are enhanced, and access efficiency of the three dimension memory device is improved.

What is claimed is:

1. A three dimension memory device, comprising:
    a plurality of word lines, divided into a plurality of word line groups;
    a plurality of first switches, receiving a common word line voltage;
    a plurality of second switches, receiving a reference ground voltage; and
    N conductive wire layers, wherein N is a positive integer larger than 1,
    wherein, in the conductive wire layers:
        a plurality of transmission conductive wires of a first conductive wire layer are connected to a plurality of transmission conductive wires of a second conductive wire layer, the transmission conductive wires of the first conductive wire layer are respectively coupled to the first switches and the second switches,
    in the word line groups:
        a first word line group is connected to the first conductive wire layer through the second conductive wire layer, and an $i^{th}$ word line group is connected to the first conductive wire layer through an $(i+1)^{th}$ conductive wire layer to the second conductive wire layer in sequence, where N>i>1.

2. The three dimension memory device as claimed in claim 1, wherein the transmission conductive wires of the first conductive wire layer are respectively connected to the transmission conductive wires of the second conductive wire layer through a plurality of through array via structures.

3. The three dimension memory device as claimed in claim 2, wherein the transmission conductive wires of the first conductive wire layer extend in a first direction to be respectively connected to the first switches and the second switches, and the transmission conductive wires of the second conductive wire layer extend in a second direction to be respectively connected to the through array via structures, wherein the first direction is different from the second direction.

4. The three dimension memory device as claimed in claim 1, wherein extending directions of the transmission conductive wires of the $N^{th}$ conductive wire layer to the second conductive wire layer are the same.

5. The three dimension memory device as claimed in claim 1, wherein the first word line group is connected to the second conductive wire layer through a plurality of contact windows corresponding to the $N^{th}$ conductive wire layer to the third conductive wire layer.

6. The three dimension memory device as claimed in claim 1, further comprising:
    a common word voltage transmission conductive wire, respectively coupled to a plurality of common word lines through a plurality of through array via structures; and
    a reference ground voltage transmission conductive wire, respectively coupled to a plurality of reference ground wires through a plurality of through array via structures,
    wherein the common word lines respectively provide the common word line voltage to the first switches, and the reference ground wires respectively provide the reference ground voltage to the second switches.

7. The three dimension memory device as claimed in claim 6, wherein extending directions of the common word voltage transmission conductive wire and the reference ground voltage transmission conductive wire are the same as extending directions of the transmission conductive wires of the second conductive wire layer.

8. The three dimension memory device as claimed in claim 1, wherein the first switches and the second switches are connected in series to form a plurality of drivers, and the drivers are respectively controlled by a plurality of control signals.

9. The three dimension memory device as claimed in claim 8, further comprising:
    a plurality of third switches, respectively coupled to output terminals of the drivers and commonly coupled to the common word line, and the third switches being respectively controlled by a plurality of inverted control signals.

10. The three dimension memory device as claimed in claim 9, wherein each of the first switches is a first transistor, each of the second switches is a second transistor, a first terminal of the first transistor receives the common word line voltage, a second terminal of the first transistor is coupled to a first terminal of the second transistor, a second terminal of the second transistor receives the reference ground voltage, and control terminals of the first transistor and the second transistor commonly receive the corresponding control signal.

11. The three dimension memory device as claimed in claim 10, wherein each of the third switches is a third transistor, a first terminal of the third transistor receives the common word line voltage, a second terminal of the third transistor is coupled to the first terminal of the second transistor, and a control terminal of the third transistor receives the corresponding inverted control signal.

12. The three dimension memory device as claimed in claim 11, wherein the first transistor is a P-type transistor, and the second transistor and the third transistor are N-type transistors.

13. The three dimension memory device as claimed in claim 11, wherein a source and a drain of each of the first transistor, the second transistor, and the third transistor have a contact window of a trench structure.

14. The three dimension memory device as claimed in claim 8, further comprising:
    a plurality of level shifters, coupled to the driver, for generating the control signals.

15. The three dimension memory device as claimed in claim 14, wherein the drivers are divided into a first driver group and a second driver group, and the first driver group and the second driver group are respectively arranged on two opposite sides of a layout area of the level shifters.

16. The three dimension memory device as claimed in claim 1, wherein lengths of a plurality of signal transmission paths from the word lines to the first switches are the same.

17. The three dimension memory device as claimed in claim 1, wherein the first switches are divided into M first switch groups, the second switches are divided into P second switch groups, the first switch groups and the second switch groups are arranged in interleaving, and M and P are positive integers.

18. The three dimension memory device as claimed in claim 17, wherein P is greater than or equal to M.

19. The three dimension memory device as claimed in claim 1, wherein the transmission conductive wires of the second conductive wire layer to the $N^{th}$ conductive wire layer are bar-shaped or L-shaped.

20. The three dimension memory device as claimed in claim 1, further comprising:
- a memory cell array, coupled to the word lines, wherein the memory cell array is an AND type flash memory cell array.

* * * * *